United States Patent
Han et al.

(10) Patent No.: US 10,337,099 B2
(45) Date of Patent: Jul. 2, 2019

(54) APPARATUS AND METHOD FOR COATING INNER WALL OF METAL TUBE

(71) Applicant: Korea Institute of Science and Technology, Seoul (KR)

(72) Inventors: Seung Hee Han, Seoul (KR); Se Hoon An, Seoul (KR); Geun Hyuk Lee, Seoul (KR); In Seol Song, Seoul (KR); Seong Woo Jang, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 275 days.

(21) Appl. No.: 15/240,253

(22) Filed: Aug. 18, 2016

(65) Prior Publication Data
US 2017/0051393 A1  Feb. 23, 2017

(30) Foreign Application Priority Data

Aug. 21, 2015  (KR) .................. 10-2015-0118130

(51) Int. Cl.
*C23C 14/34* (2006.01)
*C23C 14/16* (2006.01)
(Continued)

(52) U.S. Cl.
CPC .......... *C23C 14/165* (2013.01); *C23C 14/046* (2013.01); *C23C 14/3485* (2013.01);
(Continued)

(58) Field of Classification Search
CPC .. H01J 37/342; H01J 37/3455; H01J 37/3467; H01J 37/3458
See application file for complete search history.

(56) References Cited

U.S. PATENT DOCUMENTS 4,031,424 A   6/1977 Penfold et al.
4,376,025 A   3/1983 Zega
(Continued)

FOREIGN PATENT DOCUMENTS

JP   62180069 A  *  8/1987
JP   2000-64040 A    2/2000
(Continued)

OTHER PUBLICATIONS

Lensch, O., et al., "Protection of cylinders by ion-beam sputter deposition: corrosion of carbon-coated aluminium tubes," Surface and Coatings Technology 158, 2002, (pp. 599-603).
(Continued)

*Primary Examiner* — Jason Berman
(74) *Attorney, Agent, or Firm* — NSIP Law

(57) ABSTRACT

An apparatus and a method for coating an inner wall of a metal tube are provided. The apparatus for coating an inner wall of a metal tube includes mounting posts on which both end openings of a metal tube are mounted and configured to block the inside of the metal tube from the ambient air so that a pressure in the metal tube is adjustable by the vacuum exhaust and inflow of process gases, a sputtering target metal tube installed inside the metal tube coaxially with the metal tube, a pulse electromagnet installed around an outside perimeter of the metal tube coaxially with the metal tube to apply a pulse magnetic field in an axial direction of the metal tube, an electromagnetic pulse power supply unit configured to apply pulse power to the pulse electromagnet, and a sputtering pulse power supply unit configured to synchronize a negative high-voltage pulse with the pulse power applied to the pulse electromagnet and apply to the sputtering target metal tube.

10 Claims, 6 Drawing Sheets
(5 of 6 Drawing Sheet(s) Filed in Color)

(51) Int. Cl.
 *C23C 14/35* (2006.01)
 *H01J 37/34* (2006.01)
 *C23C 14/04* (2006.01)
 *H01J 37/32* (2006.01)

(52) U.S. Cl.
 CPC ............ *C23C 14/35* (2013.01); *C23C 14/351* (2013.01); *H01J 37/32394* (2013.01); *H01J 37/32669* (2013.01); *H01J 37/3405* (2013.01); *H01J 37/3423* (2013.01); *H01J 37/3426* (2013.01); *H01J 37/3467* (2013.01)

(56) References Cited

U.S. PATENT DOCUMENTS

| | | | | |
|---|---|---|---|---|
| 5,753,089 | A | * | 5/1998 | Haag ................ H01J 37/32779 204/192.12 |
| 6,436,252 | B1 | | 8/2002 | Tzatzov et al. |
| 2006/0076231 | A1 | * | 4/2006 | Wei ...................... C23C 14/046 204/192.12 |
| 2006/0207871 | A1 | * | 9/2006 | Yumshtyk ............... C23C 14/35 204/192.1 |

FOREIGN PATENT DOCUMENTS

| | | |
|---|---|---|
| JP | 2000-64040 A | 2/2000 |
| JP | 2010-225517 A | 10/2010 |
| KR | 10-2004-0005406 A | 1/2004 |
| KR | 10-2008-0098826 A | 11/2008 |

OTHER PUBLICATIONS

Thornton, J., "Magnetron sputtering: basic physics and application to cylindrical magnetrons," Journal of Vacuum Science & Technology, 15.2, 1978, (8 pages).

Korean Office Action issued in counterpart Korean Application No. 10-2015-0118130 dated Apr. 12, 2017 (1 page in English; 6 pages in Korean).

Korean Office Action dated Oct. 4, 2016 in counterpart Korean Application No. 10-2015-0118130 (1 page in English; 6 pages in Korean).

* cited by examiner

APPARATUS AND METHOD FOR COATING INNER WALL OF METAL TUBE

CROSS-REFERENCE TO RELATED APPLICATION

This application claims priority to and the benefit of Korean Patent Application No. 2015-0118130, filed on Aug. 21, 2015, the disclosure of which is incorporated herein by reference in its entirety.

BACKGROUND

1. Field of the Invention

The present invention relates to an apparatus and a method for coating an inner wall of a metal tube, and more particularly, to an apparatus and a method for coating an inner wall of a metal tube, which is capable of depositing a coating layer on an inner wall of a long metal tube in a hollow tube form to protect the inner wall of the metal tube and improve functionality.

2. Discussion of Related Art

To protect an inside surface, that is, an inner wall, of a metal tube from corrosion, oxidation, erosion, wear, and the like and improve functionality, there has been a constantly increasing need to deposit a coating layer on an inner wall of the metal tube. For example, although hard chromium plating on inner walls of gun and cannon barrels of military weapons is used, there is a demand for an alternative technology of depositing a coating layer to improve durability, etc.

Various methods of depositing a coating layer on a surface of a conventional sample have been known and generally used in the art, but apparatuses and methods for coating an inner wall of a metal tube capable of coating an inner wall of a long metal tube have not been commercialized yet.

As a method of coating an inner wall of a metal tube, a cited reference ("Protection of cylinders by ion-beam sputter deposition: corrosion of carbon-coated aluminum tubes"— O. Lensch et al., Surf. Coat. Technol. 158-159 (2002) 599-603) discloses a method of coating the inside of a metal tube, which includes inserting a conical sputtering target into the metal tube and then irradiating the sputtering target with ion beams to sputter a target material. However, while in principle such a method may be used to coat an inner wall of a metal tube, it is known that there is a difficulty for using the method for commercial purposes.

Also, as another method of coating an inner wall of a metal tube, a technology of coating a target element on an inner wall of a metal tube by inserting a rod- or tube-shaped metal (a sputtering target) made of a coating layer (film) material into a metal tube whose inner wall is to be coated, applying a negative voltage to the sputtering target to cause a plasma phenomenon, thereby causing a sputtering phenomenon. However, in this widely known method of coating an inner wall of a metal tube, a permanent magnet needs be inserted into the metal tube to form a magnetic field, and the method has a problem in that the permanent magnet cannot be easily inserted into the metal tube due to space constraints when the metal tube has a small internal diameter, making it difficult to apply the technique to the coating of an inner wall of the metal tube having a small internal diameter.

SUMMARY OF THE INVENTION

The present invention is directed to an apparatus and a method for coating an inner wall of a metal tube, which is capable of depositing a coating layer on an inner wall of a long metal tube in a hollow tube form using a magnetron sputtering coating process.

Also, the present invention is directed to an apparatus and a method for coating an inner wall of a metal tube, which is capable of performing magnetron sputtering coating by generating a magnetic field required for a magnetron sputtering coating process in the form of a pulse magnetic field using a pulse electromagnet mounted outside a metal tube and applying a negative high-voltage pulse synchronized with the pulse magnetic field generated by the pulse electromagnet to a sputtering target metal tube mounted inside the metal tube, thereby generating plasma around an inner wall of the metal tube.

Further, the present invention is directed to an apparatus and a method for coating an inner wall of a metal tube, which is capable of coating an inner wall of a long metal tube while minimizing the size of a pulse electromagnet installed outside the metal tube and uniformly depositing a magnetron sputtering coating layer on the entire inner part of the metal tube since the pulse electromagnet is movably formed in a length direction of the metal tube.

According to an aspect of the present invention, there is provided an apparatus for coating an inner wall of a metal tube, which includes mounting posts on which both end openings of a metal tube sample are mounted and configured to block the inside of the metal tube sample from ambient air so that pressure in the metal tube sample is adjustable by the vacuum exhaust and inflow of process gases, a sputtering target metal tube installed inside the metal tube sample coaxially with the metal tube sample, a pulse electromagnet installed around an outside perimeter of the metal tube sample coaxially with the metal tube sample to apply a pulse magnetic field in an axial direction of the metal tube sample, an electromagnetic pulse power supply unit configured to generate a negative high-voltage pulse synchronized with the pulse power applied to the pulse electromagnet and apply the synchronized negative high-voltage pulse to the sputtering target metal tube.

According to the present invention, the apparatus for coating an inner wall of a metal tube may further include a pulse electromagnet movement unit configured to move the pulse electromagnet back and forth in an axial direction of the metal tube.

According to the present invention, the apparatus for coating an inner wall of a metal tube may further include a delayed pulse signal generation unit configured to provide a driving signal pulse to the electromagnetic pulse power supply unit and the sputtering pulse power supply unit so that the negative high-voltage pulse applied to the sputtering target metal tube is applied at a predetermined delayed time after the pulse power is applied to the pulse electromagnet.

According to the present invention, a cooling metal tube through which cooling water is introduced and discharged may be installed along an inside perimeter of the sputtering target metal tube to cool the sputtering target metal tube.

According to the present invention, a permanent magnet assembly including permanent magnets may be installed inside the cooling metal tube in an axial direction.

According to another aspect of the present invention, there is provided a method of coating an inner wall of a metal tube, which includes (a) mounting both end openings of a metal tube sample on mounting posts so that pressure in the metal tube sample is adjustable by the vacuum exhaust and inflow of process gases, (b) coaxially installing a sputtering target metal tube inside the metal tube sample, (c) installing a pulse electromagnet around an outside perimeter of the metal tube sample coaxially with the metal tube sample, (d) vacuum-exhausting the inside of the metal tube sample, (e) allowing a process gas to flow in the inside of the metal tube sample to set a process gas pressure, (f) applying pulse power to the pulse electromagnet to form a pulse magnetic field around the sputtering target metal tube, and (g) generating a negative high-voltage pulse synchronized with the pulse power applied to the pulse electromagnet and applying the synchronized negative high-voltage pulse to the sputtering target metal tube, thereby generating plasma.

According to the present invention, when a coating process is started by the pulse magnetic field formed by the pulse electromagnet and the negative high-voltage pulse applied to the sputtering target metal tube, the inner wall of the metal tube sample may be coated while moving the pulse electromagnet back and forth in an axial direction of the metal tube sample.

According to the present invention, the process gas pressure set inside the metal tube sample may be used in a range of 1 mTorr to 1 Torr.

According to the present invention, the pulse power applied to the pulse electromagnet and the sputtering target metal tube may have a pulse frequency of 10 Hz to 1,000 Hz.

According to the present invention, the pulse magnetic field formed around the pulse electromagnet may have an strength of 0.1 kG to 10 kG.

According to the present invention, the negative high-voltage pulse applied to the sputtering target metal tube may have a pulse voltage of 500 V to 2,000 V, and the negative high-voltage pulse applied to the sputtering target metal tube may have a pulse width of 10 to 1,000 μsec.

According to the present invention, the negative high-voltage pulse applied to the sputtering target metal tube may be applied at a predetermined delayed time after the pulse power is applied to the pulse electromagnet, and the time delay may be in a range of 50 μsec to 500 μsec.

BRIEF DESCRIPTION OF THE DRAWINGS

The patent or application file contains a least one drawing executed in color. Copies of this patent or patent application publication with color drawing(s) will be provided by the Office upon request and payment of the necessary fee. The above and other objects, features and advantages of the present invention will become more apparent to those of ordinary skill in the art by describing in detail exemplary embodiments thereof with reference to the accompanying drawings, in which.

Figure 1:
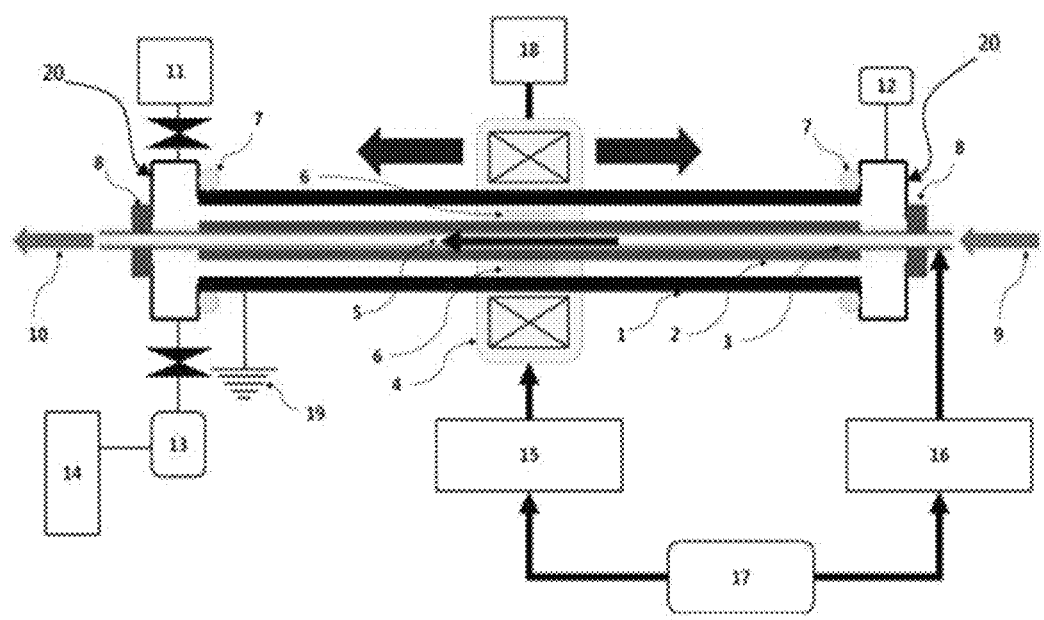
FIG. 1 is a schematic diagram showing an apparatus for coating an inner wall of a metal tube according to one exemplary embodiment of the present invention.

| [Explanations of reference numerals of drawings] | |
|---|---|
| 1: | metal tube sample |
| 2: | sputtering target metal tube |
| 3: | cooling metal tube |
| 4: | pulse electromagnet |
| 5: | pulse magnetic field |
| 6: | pulse plasma |
| 7: | vacuum connector |
| 8: | vacuum insulation connector |
| 11: | vacuum pump |
| 12: | vacuum gauge |
| 13: | gas input unit |
| 14: | gas supply unit |
| 15: | electromagnetic pulse power supply unit |
| 16: | sputtering pulse power supply unit |
| 17: | delayed pulse signal generation unit |
| 18: | electromagnet movement unit |
| 19: | ground for metal tube |
| 20: | mounting post |
| 30: | permanent magnet assembly |
| 32: | permanent magnet |
| 34: | spacer |

DETAILED DESCRIPTION OF EXEMPLARY EMBODIMENTS

Exemplary embodiments of the present invention will be described in detail below with reference to the accompanying drawings. While the present invention is shown and described in connection with exemplary embodiments thereof, it will be apparent to those skilled in the art that various modifications can be made without departing from the scope of the invention.

Unless specifically stated otherwise, all the technical and scientific terms used in this specification have the same meanings as what are generally understood by a person skilled in the related art to which the present invention belongs. In general, the nomenclature used in this specification and the experimental methods described below are widely known and generally used in the related art.

FIG. 1 is a schematic diagram showing an apparatus for coating an inner wall of a metal tube according to one exemplary embodiment of the present invention.

Referring to FIG. 1, an apparatus for coating an inner wall of a metal tube according to one exemplary embodiment of the present invention includes mounting posts 20 on which both end openings of a metal tube sample 1 that is an object on which to perform a process of coating an inner wall of a metal tube are mounted, a sputtering target metal tube 2 made of a material to be coated, a pulse electromagnet 4, an electromagnetic pulse power supply unit 15, and a sputtering pulse power supply unit 16, preferably further includes a delayed pulse signal generation unit 17 and a pulse electromagnet movement unit 18.

As the object on which to perform a process of coating an inner wall of a metal tube, a long metal tube in a hollow tube form may be used as the metal tube sample 1. The metal tube sample 1 is mounted on the mounting posts 20 connected to the ground 19.

When both end openings of the metal tube sample 1 are mounted on the mounting posts 20, the mounting posts 20 isolate an inner part of the metal tube sample 1 from the ambient air so that magnetron sputtering deposition may be performed on the inner part of the metal tube sample 1. The inner part of the metal tube sample 1 is vacuum-exhausted with the metal tube sample 1 mounted on the mounting posts 20, and a process gas is allowed to flow in the metal tube sample 1 to set a process gas pressure for magnetron sputtering deposition. The mounting posts 20 are coupled to the metal tube sample 1 using a vacuum connector 7 serving to enable vacuum sealing and configured to quickly exchange and mount the metal tube sample 1 by the vacuum connector 7.

A vacuum pump 11, a vacuum gauge 12 and a gas input unit 13 are coupled to the mounting posts 20. The vacuum pump 11 is coupled to one of the mounting posts 20 to vacuum-exhaust the inside of the metal tube sample 1. In this case, the inside of the metal tube sample 1 is exhausted until the vacuum level inside the metal tube sample 1 reaches a high vacuum region. After the vacuum exhausting, a process gas is allowed to flow in the inside of the metal tube sample 1 through the gas input unit 13 to regulate pressure inside the metal tube. A gas supply unit 14 is coupled to the gas input unit 13 to supply a gas used for processes to the inside of the metal tube sample 1. In this case, a process gas such as argon may be used. The vacuum gauge 12 may be coupled to one of the mounting posts 20 to measure the vacuum level inside the metal tube sample 1 and a process pressure due to the process gas.

The sputtering target metal tube 2 made of a material to be coated is installed inside the metal tube sample 1 on the same axis as the metal tube sample 1 spaced apart from an inner wall of the metal tube sample 1.

A cooling water channel configured to cool the sputtering target metal tube 2 is formed inside the sputtering target metal tube 2. Preferably, a hollow cooling metal tube 3 is installed inside the sputtering target metal tube 2, and cooling water used to cool the sputtering target metal tube 2 inside the cooling metal tube 3.

The cooling metal tube 3 extends outward through the two mounting posts 20 and is coupled to the mounting posts 20 via a vacuum insulation connector to enable vacuum sealing of the inside of the metal tube sample 1 and electrical insulation from the metal tube sample 1. One side of the cooling metal tube 3 is coupled to a cooling water inlet port 9, and the other side of the cooling metal tube 3 is coupled to a cooling water outlet port 10 in order to cool the sputtering target metal tube 2 while allowing cooling water to flow along the inner part of the cooling metal tube 3. The cooling water inlet port 9 and the cooling water outlet port 10 may be coupled to the sputtering target metal tube 2 so that cooling water is allowed to flow in the inside of the sputtering target metal tube 2 without using the cooling metal tube 3.

The sputtering pulse power supply unit 16 configured to apply a negative high-voltage pulse to perform a magnetron sputtering process is coupled to the sputtering target metal tube 2. When the cooling metal tube 3 is provided, the sputtering pulse power supply unit 16 may apply a negative high-voltage pulse to the sputtering target metal tube 2 via the cooling metal tube 3.

The pulse electromagnet 4 is installed around an outside perimeter of the metal tube sample 1. The pulse electromagnet 4 surrounds the metal tube sample 1 and may be installed coaxially with the metal tube sample 1 to apply a pulse magnetic field in an axial direction of the metal tube sample 1.

The electromagnetic pulse power supply unit 15 is coupled to the pulse electromagnet 4 to apply a pulse current to a coil of the pulse electromagnet 4, thereby generating a pulse magnetic field.

According to one exemplary embodiment of the present invention, the pulse electromagnet 4 is installed to move back and forth in an axial direction of the metal tube sample 1. Since a target metal is deposited on the inner wall of the metal tube sample 1 as the pulse electromagnet 4 moves back and forth in an axial direction of the metal tube sample, it is possible to deposit a coating layer on the entire inner wall of the long metal tube sample 1 while minimizing the length of the pulse electromagnet 4. Also, it is possible to form a uniform coating layer on the inner wall of the metal tube sample 1.

The pulse electromagnet movement unit 18 moves the pulse electromagnet back and forth parallel to an axial direction of the metal tube sample 1 while supporting the pulse electromagnet 4.

The electromagnetic pulse power supply unit 15 and the sputtering pulse power supply unit 16 receives a driving signal pulse from the delayed pulse signal generation unit 17 to apply pulse power to the pulse electromagnet and the sputtering target metal tube. The delayed pulse signal generation unit 17 is configured to control frequency, pulse duration and time delay of the pulse power applied to the pulse electromagnet 4 and the sputtering target metal tube 2. Here, the negative high-voltage pulse applied to the sputtering target metal tube 2 is controlled by the delayed pulse signal generation unit 17 so that the negative high-voltage pulse is applied at a predetermined delayed time after a driving pulse is applied to the pulse electromagnet 4. By considering the delayed time at which the pulse magnetic field is formed around the pulse electromagnet 4, the negative high-voltage pulse applied to the sputtering target metal tube 2 may be controlled so that the negative high-voltage pulse is applied after a predetermined delayed time. As a result, when the size of the pulse magnetic field is maximized, a magnetron discharge may be performed to maximize the deposition rate of a coating film.

Figure 2:
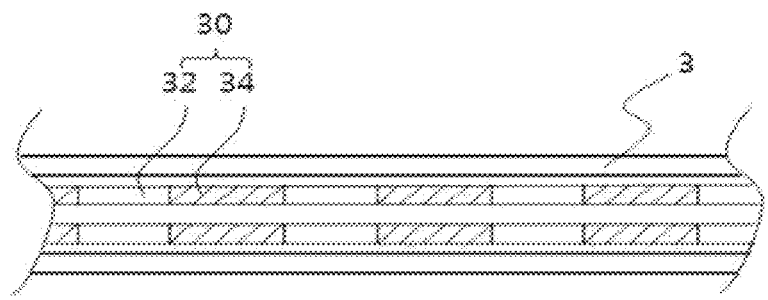
FIG. 2 is a partial schematic diagram for describing an apparatus for coating an inner wall of a metal tube according to another exemplary embodiment of the present invention.

FIG. 2 is a partial diagram for describing an apparatus for coating an inner wall of a metal tube according to another exemplary embodiment of the present invention. Here, a permanent magnet assembly 30 is installed inside the cooling metal tube 3. The apparatus according to another exemplary embodiment of the present invention has the same configuration as the apparatus according to one exemplary embodiment of the present invention as shown in FIG. 1, except that a permanent magnet assembly 30 is installed, therefore other configurations are omitted.

Referring to FIG. 2, a permanent magnet assembly 30 is installed inside the cooling metal tube 3 coaxially with the metal tube sample 1. The permanent magnet assembly 30 includes ring-shaped permanent magnets 32 and a spacer 34 installed between the permanent magnets 32. Here, the spacer 34 is manufactured using a non-magnetic material such as stainless steel. The spacer 34 serves to generate a leakage magnetic field in the permanent magnet assembly. In the apparatus for coating an inner wall of a metal tube, the size of the pulse magnetic field has a great influence on plasma generation. In this case, the permanent magnet assembly 30 installed inside the cooling metal tube 3 serves to further enhance the size of the pulse magnetic field.

Figure 3:
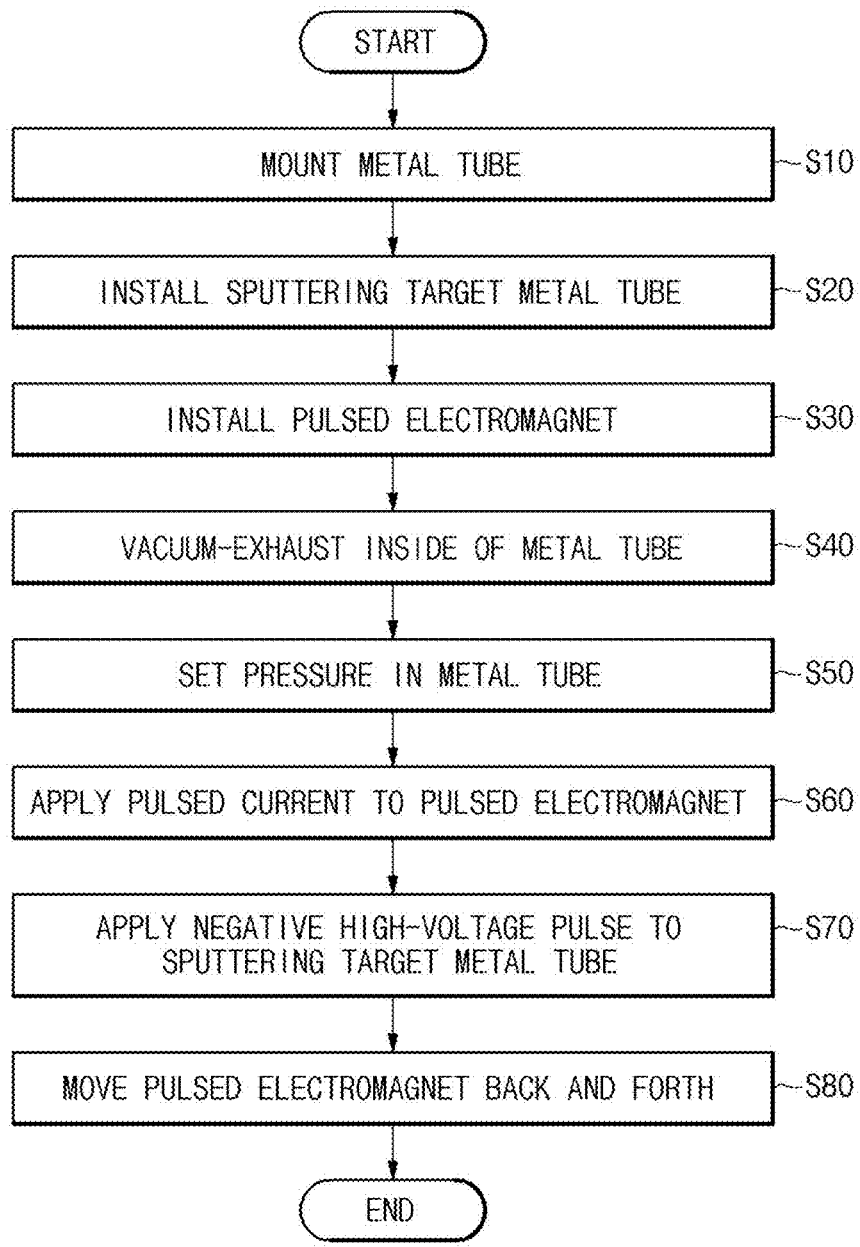
FIG. 3 is a flowchart for describing a coating method using the apparatus for coating an inner wall of a metal tube according to one exemplary embodiment of the present invention.

FIG. 3 is a flowchart for describing a coating method using the apparatus for coating an inner wall of a metal tube according to one exemplary embodiment of the present invention. Here, an operation and an operational principle of the apparatus for coating an inner wall of a metal tube will be described with reference to FIG. 3.

Referring to FIG. 3, first of all, a process is performed for installing on mounting posts 20 a metal tube sample 1 on which to perform a coating process (S10).

The mounting posts 20 serve to isolate the inside of the metal tube sample 1 from the ambient air so that a process gas pressure in the metal tube sample 1 is adjustable by the vacuum exhaust and inflow of process gases into the metal tube sample 1. The metal tube sample 1 is mounted by coupling both end openings of the metal tube sample 1 to the mounting posts 20 via the vacuum connector 7. The metal tube sample 1 is electrically connected to the ground.

Next, the sputtering target metal tube 2 is coaxially installed inside the metal tube sample 1 (S20).

When the cooling metal tube 3 is provided along an inside perimeter of the sputtering target metal tube 2, the sputtering target metal tube 2 may be easily installed inside the metal tube sample 1 by coaxially installing the cooling metal tube 3 inside the metal tube sample 1 and installing the sputtering target metal tube 2 around an outside perimeter of the cooling metal tube 3.

The sputtering target metal tube 2 has a length such that the sputtering target metal tube 2 does not extend beyond the mounting posts 20. After the cooling metal tube 3 and the sputtering target metal tube 2 disposed around an outside perimeter of the cooling metal tube 3 are installed inside the metal tube sample 1, the cooling metal tube 3 and the sputtering target metal tube 2 coupled to the cooling metal tube 3 is electrically insulated with the metal tube sample 1 using the vacuum insulation connector 8, and the mounting posts 20 are vacuum-sealed to for vacuum-exhausting the inside the metal tube sample 1.

Subsequently, the pulse electromagnet 4 configured to form a pulse magnetic field around an outside perimeter of the metal tube sample 1 surrounds and is installed coaxially with the metal tube sample 1 (S30).

Then, the inner part of the metal tube sample 1 is exhausted using the vacuum pump 11 until the vacuum level of the inside of the metal tube sample 1 reaches a high vacuum regime (S40).

Then, a process gas (for example, argon, etc.) of a gas supply unit 14 is allowed to flow in the inside of the metal tube sample 1 while the flow rate of the process gas 14 is adjusted in order to set a process gas pressure in the metal tube sample 1 (S50).

The pressure in the metal tube sample 1 is preferably adjusted to be in a range of 1 mTorr to 1 Torr. This is because a magnetron sputtering operation is difficult when the gas pressure in the metal tube sample 1 is low (e.g., less than 1 mTorr) whereas performing a deposition process is difficult due to severe arc formation between the metal tube sample 1 and the sputtering target metal tube 2 when a high voltage applied to the sputtering target metal tube with a high gas pressure (e.g., greater than 1 Torr). More preferably, the pressure in the metal tube sample 1 is set in a range of 30 to 300 mTorr in order to perform a deposition process with improved efficiency of the magnetron sputtering process and preventing arc formation between the metal tube sample 1 and the sputtering target metal tube 2.

When the pressure in the metal tube sample 1 is stabilized after the inflow of the gas, cooling water is allowed to circulate in the cooling metal tube 3 to cool the sputtering target metal tube 2. The cooling water may be introduced to circulate through the cooling metal tube 3 after the vacuum exhausting.

Next, a pulse magnetic field is formed in an axial direction of metal tube sample 1 by inputting a driving pulse signal generated at the delayed pulse signal generation unit 17 into the electromagnetic pulse power supply unit 15 so that a pulse current is applied to the pulse electromagnet 4 (S60).

The electromagnetic pulse power supply unit 15 is preferably operated at a pulse frequency of 10 to 1,000 Hz, a pulse width of 100 to 1,000 μsec, and a pulse current of 10 to 500 A. When a low operating frequency of 10 Hz or less is used as the pulse frequency, efficient deposition may not be realized due to a low deposition rate. On the other hand, when a high frequency of 1,000 Hz or more is used, the pulse electromagnet may be overheated due to high power consumption by the pulse electromagnet. Also, when a pulse width of 100 μsec or less is used, it is difficult to form a proper magnetic field due to an effect of delayed magnetic field formation caused by inductance of the pulse electromagnet. On the other hand, when a pulse width of 1,000 μsec or less is used, the pulse electromagnet may be overheated due to high power consumption by the pulse electromagnet. Further, when a pulse current of 10 A is used as the pulse current, an effective magnetron deposition may not be realized due to a weak magnetic field intensity. On the other hand, when a pulse current of 500 A or more is used, the pulse electromagnet may be overheated due to high power consumption by the pulse electromagnet.

The strength of the pulse magnetic field formed using such a pulse current is preferably in a range of 0.1 kG to 10 kG. This is because it is difficult to maintain a magnetron sputtering discharge under a magnetic field having a strength of 0.1 kG or less and a large amount of power needs to be consumed by the pulse electromagnet to form a magnetic field having a strength of 10 kG or more, causing high power consumption to cause overheating of the pulse electromagnet.

After the pulse magnetic field is formed by such a method, a magnetron sputtering coating process is performed by applying a negative high-voltage pulse voltage to the sputtering target metal tube 2 using the sputtering pulse power supply unit 16 and the delayed pulse signal generation unit 17 configured to drive the sputtering pulse power supply unit 16 (S70).

The negative high-voltage pulse applied to the sputtering target metal tube 2 needs to be synchronized with the pulse electromagnet at the same frequency because an effective magnetron sputtering discharge may occur only when the negative high-voltage pulse is applied to the sputtering target metal tube 2 during formation of the pulse magnetic field.

According to the present invention, preferably the frequency of the negative high-voltage pulse applied to the sputtering target metal tube 2 is in a range of 10 to 1,000 Hz and the negative high-voltage pulse should be applied to have the same frequency as the pulse magnetic field, the pulse width in a range of 10 to 1,000 µsec, and the pulse voltage is preferably in a range of 500 to 2,000 V. This is because an effective magnetron deposition may not be realized when a pulse width of 10 µsec or less is used whereas arcs may be formed due to a high voltage when a longer pulse width of 1,000 µsec or more is used. Also, when a low voltage of 500 V or less is used, it is difficult to perform a magnetron plasma discharge. On the other hand, when a high voltage of 2,000 V or more is used, disadvantages are that severe arcs may be formed between the sputtering target metal tube and the metal tube sample 1, making it difficult to perform a deposition process, and that manufacturing a high-voltage pulse generation unit with a high voltage of 2,000 V or more is difficult.

Figure 4:
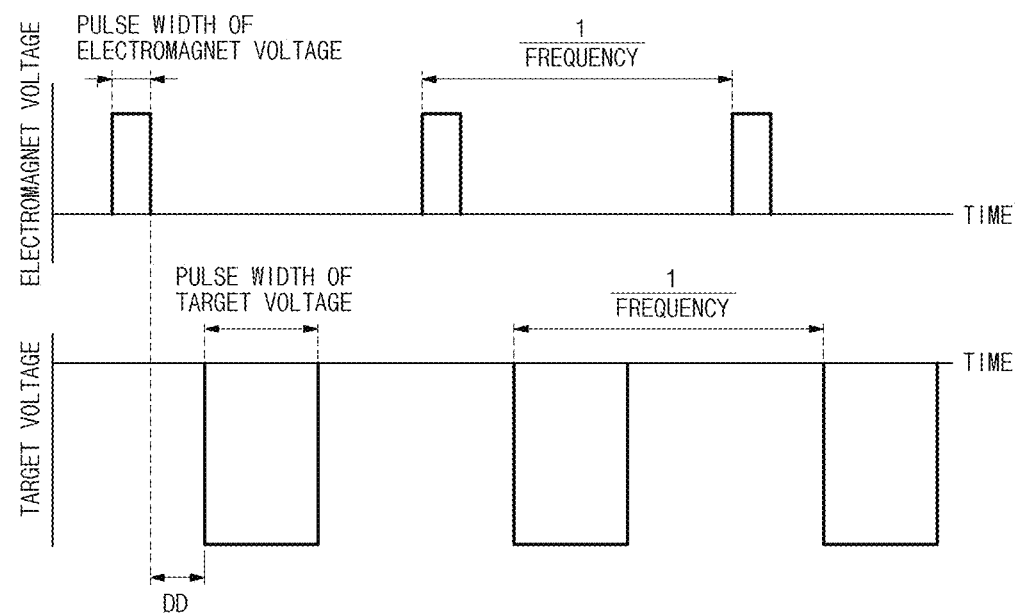
FIG. 4 is a conceptual diagram of application duration of a pulse voltage applied to a pulse electromagnet and a sputtering target metal tube in a method of coating an inner part of a metal tube according to exemplary embodiment of the present invention.

According to the present invention, the negative high-voltage pulse applied to the sputtering target metal tube 2 is preferably applied after a time delay, as schematically shown in FIG. 4. Due to the delayed time at which the pulse magnetic field is formed around the pulse electromagnet, an optimal magnetron discharge may be realized when the negative high-voltage pulse is applied after a predetermined delayed time.

Preferably, the negative high-voltage pulse applied to the sputtering target metal tube 2 is preferably applied after a time delay of 50 µsec to 500 µsec after the pulse electromagnet driving pulse is applied. This is because a deposition rate of the coating film may be maximized by performing a magnetron discharge when the size of the pulse magnetic field reaches the maximum. When a short time delay of 50 µsec or a long time delay of 500 µsec is used, the maximum pulse magnetic field is not formed, resulting in reduced magnetron sputtering discharge efficiency. More preferably, the pulse time delay is in a range of 150 µsec to 400 µsec. In this case, it is possible to maximize magnetron sputtering efficiency.

In such a method, when a magnetron sputtering coating is initiated by the pulse magnetic field formed by the pulse electromagnet 4 and the negative high-voltage pulse applied to the sputtering target metal tube 2, the pulse electromagnet movement unit 18 is used to move the pulse electromagnet 4 back and forth parallel to an axial direction of the metal tube sample 1. In this way, it is possible to coat the entire inner wall of the metal tube sample 1 having a length larger than the pulse electromagnet 4.

According to the present invention, magnetron sputtering coating may be performed by generating a magnetic field absolutely required for a magnetron sputtering coating process in the form of a pulse magnetic field using the pulse electromagnet mounted outside the metal tube, generating a negative high-voltage pulse synchronized with the pulse magnetic field generated by the pulse electromagnet and applying the synchronized negative high-voltage pulse to the sputtering target metal tube mounted inside the metal tube and made of a coating film material, thereby generating magnetron pulse plasma 6 around the sputtering target metal tube 2.

Also, when plasma is allowed to move by moving the pulse electromagnet 4 back and forth parallel to a length direction of the metal tube sample 1, a magnetron sputtering coating film may be effectively deposited on the entire inside of the metal tube sample 1 having a length larger than the pulse electromagnet 4.

Example 1

A coating experiment on an inner wall of a metal tube was performed using the apparatus for coating an inner wall of a metal tube according to one exemplary embodiment of the present invention, as follows.

A metal tube made of stainless steel with an external diameter of 25.4 mm, an internal diameter of 22 mm, and a length of 1 m was used as a metal tube sample 1 to be coated. First of all, the metal tube sample 1 was mounted using a vacuum connector 7, and a cooling metal tube 3 made of stainless steel with an external diameter of 10 mm, an internal diameter of 9 mm, and a length of 1.4 m was then mounted inside the metal tube sample 1 using a vacuum insulation connector 8. In this case, a copper tube having an external diameter of 12 mm, an internal diameter of 10.2 mm, and a length of 1 m was installed around an outside perimeter of the cooling metal tube 3 and used as a sputtering target metal tube 2.

For this example, a pulse electromagnet 4 was manufactured as follows. That is, a coil bobbin made of positively oxidized aluminum with an external diameter of 34 mm, an internal diameter 30 mm, and a length of 100 mm was used, and a 0.12/250-sized Litz wire was used as a pulse electromagnetic coil. A pulse electromagnet was manufactured by winding a pulse electromagnetic coil six times so that the total coil turn number is 300 turns. After the manufacture of the pulse electromagnet, the pulse electromagnetic coil was measured to have an inductance value of 1,500 µH. The pulse electromagnet 4 thus manufactured was installed at the metal tube sample 1 to axially form a pulse magnetic field around a copper metal tube serving as a sputtering target metal tube 2.

After the mounting of the metal tube sample 1, the copper metal tube serving as the sputtering target metal tube 2, the pulse electromagnet 4, and the like was completed, a vacuum pump was operated to vacuum-exhaust the inside of the metal tube sample 1 until the vacuum level reaches a high vacuum of $5 \times 10^{-6}$ Torr, and cooling water was circulated to cool the copper metal tube serving as the sputtering target metal tube 2. Thereafter, argon (Ar) gas used for sputtering was allowed to flow in at a flow rate of 50 seem so that a process gas pressure in the metal tube sample was maintained at 150 mTorr.

After the pressure in the metal tube sample 1 is stabilized at 150 mTorr, a pulse voltage having a frequency of 200 Hz, a pulse width of 150 µsec, a pulse voltage of 150 V and a pulse current of 60 A was applied to the coil of the pulse electromagnet 4 to form a pulse magnetic field with a strength of 2.26 kG around the copper metal tube serving as the sputtering target metal tube 2. At the same time, a magnetron sputtering process was performed by applying a high-voltage pulse with a frequency of 200 Hz, a pulse width of 500 µsec, a pulse voltage of −1.3 kV and a pulse current of 3.5 A to the target copper metal tube using the delayed pulse signal generation unit 17 and the sputtering pulse power supply unit 16 in order to generate pulse plasma. Meanwhile, since the high-voltage pulse applied to the copper metal tube had a time delay of 150 µsec with respect to the magnetic pulse, the high-voltage pulse was applied to the target copper metal tube when the size of the pulse magnetic field reached the maximum limit.

After the magnetron coating process was started using such a method, a coating process was performed on the inside of the metal tube sample 1 for an hour by allowing the pulse electromagnet 4 to move back and forth parallel to a length direction of the metal tube sample 1 at a moving rate of 2.2 cm/sec using the pulse electromagnet movement unit 18.

Figure 5:
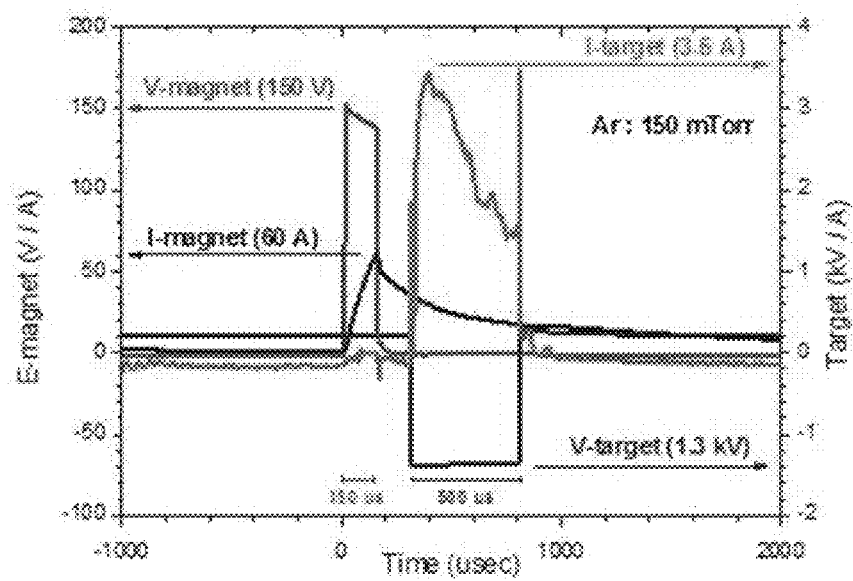
FIG. 5 is a diagram of pulse waveforms on an oscilloscope obtained by measuring a pulse voltage and current in a coating experiment on an inner wall of a metal tube in Example 1 of the present invention.

FIG. 5 shows pulse waveforms obtained using an oscilloscope by measuring a pulse voltage and current applied to the pulse electromagnet and the target copper metal tube measured during a coating experiment on an inner wall of a metal tube using the method of Example 1.

As can be seen from FIG. 5, it could be seen that a pulse current of 60 A was applied to the pulse electromagnetic coil by a pulse voltage of 150 V which was applied to the pulse electromagnet, corresponding to a power requirement of approximately 9 kW when a direct current rather than a pulse current is used for the electromagnet. Severe heating problems may be caused in the electromagnet due to such high power, and the electromagnet has to become large and heavy since it is absolutely necessary to circulate cooling water in the electromagnet. Therefore, advantages of using the pulse electromagnet according to one exemplary embodiment of the present invention can be readily recognized.

Also, the maximum power density applied to the target copper metal tube was 120 W/cm$^2$, and thus a very high power density was used compared to a widely used magnetron sputtering method (10 W/cm$^2$ or less). As a result, it could be expected that a deposition film coated on the inside of the metal tube sample 1 had excellent film qualities due to a very high ionization rate of copper being sputtered.

Example 2

To measure a time delay effect of the high-voltage pulse applied to the target copper metal tube on the magnetic pulse, an experiment was performed in the same manner as in Example 1, except that the high-voltage pulse was applied after a predetermined time delay.

Figure 6:
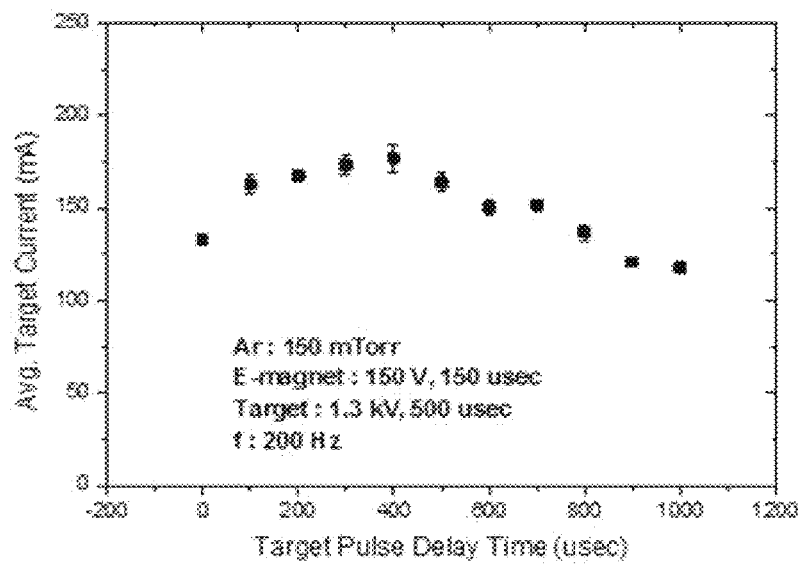
FIG. 6 is a diagram showing experimental results of measuring a time delay effect of a high-voltage pulse applied to a target copper metal tube on a magnetic pulse in Example 2 of the present invention.

That is, an average current of the sputtering pulse power supply unit was measured as the high-voltage pulse applied to the target copper metal tube was delayed to 0 to 1,000 μsec after the magnetic pulse was generated. As can be seen from FIG. 6, it could be seen that a level of plasma current was low since the high-voltage pulse was applied before the size of the pulse magnetic field reached the maximum when the pulse time delay was too short. Also, it could be seen that a level of plasma current is measured to be low due to decreasing size of the pulse magnetic field when the pulse time delay was too large. Therefore, it could be seen that the pulse time delay required to maximize magnetron sputtering efficiency was most preferably in a range of 150 μsec to 400 μsec.

Example 3

In this example, to further increase the size of the pulse magnetic field having an important influence on the generation of pulse plasma according to another exemplary embodiment of the present invention, an experiment was performed where a permanent magnet array is inserted into the inside of the cooling metal tube 3.

Figure 7:
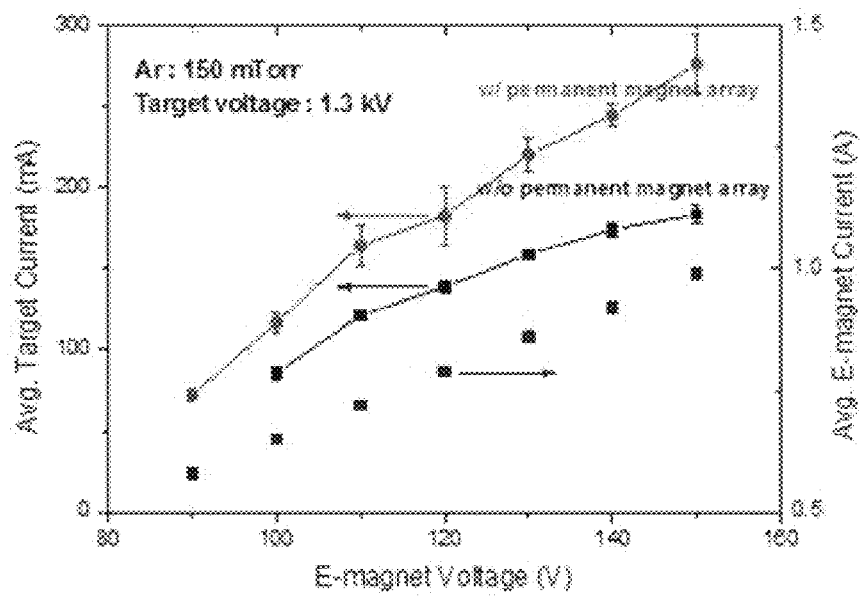
FIG. 7 is a diagram showing results of measuring an average current of a sputtering pulse power supply unit while varying applied voltage to a pulse electromagnet for cases of using and not using a permanent magnet array in an inner part of a cooling metal tube in Example 3 of the present invention.

An Nd—Fe—B magnet (N45 material) having an external diameter of 6.35 mm, an internal diameter of 3.2 mm and a height of 3.2 mm was used as a permanent magnet used in this example, and a 4 mm-thick stainless steel spacer was installed between the permanent magnets to form a leakage magnetic field. FIG. 7 is a diagram showing results of measuring an average current for the sputtering pulse power supply unit with a varying voltage applied to the pulse electromagnet 4 with and without using the permanent magnet array.

As can be seen from FIG. 7, it could be seen that a magnetron discharge was not generated at a voltage of 100 V or less applied to the pulse electromagnet when the permanent magnet was not used, but the voltage applied to the pulse electromagnet was reduced to 90 V when the permanent magnet array was inserted. Also, it could be seen that the deposition rate also proportionally increased since the average current of the sputtering pulse power supply unit increased by 30% when the permanent magnet array was used.

Example 4

In this example, after an inner wall of a metal tube was coated for an hour using the method used in Example 1, the thickness of a copper thin film coated on the inside of a 1 m-long metal tube sample was measured to determine a deposition rate.

Figure 8A:
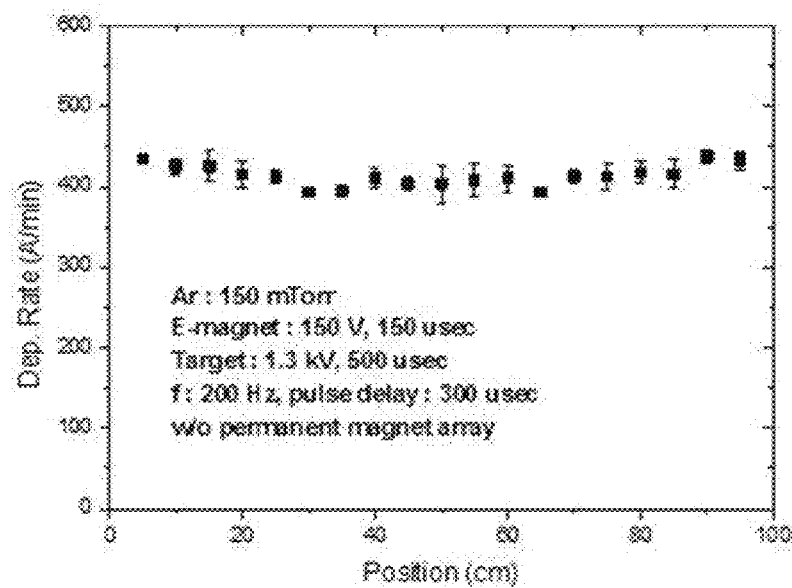
FIGS. 8A and 8B are diagrams showing experimental results (FIG. 8A) of measuring a deposition rate of a copper thin film coated onto an inner wall of a metal tube one hour after a coating experiment on an inner wall of a 1 m-long metal tube sample in Example 4 of the present invention and analysis results (FIG. 8B) of measuring a composition distribution of the deposited copper thin film around the thickness direction.
Figure 8B:
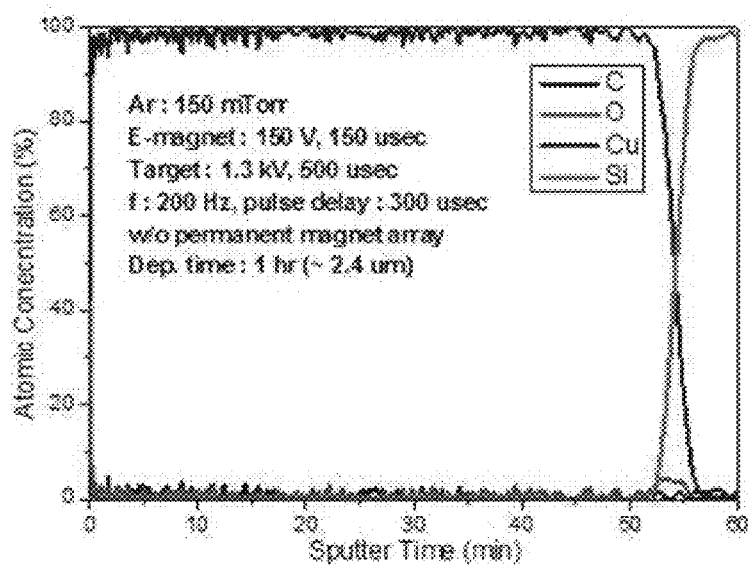

As shown in FIG. 8A, it could be seen that the deposition rate of the copper thin film deposited on the inner wall of the metal tube sample inner wall reached 40 nm/sec, and the uniformity of the deposition rate was within approximately 5%, indicating that a uniform thin film was deposited on the entire surface of the 1 m-long metal tube sample. Also, to check compositions of impurities in the copper thin film coated on the inside of the metal tube sample, an Auger surface analysis was performed by inserting a silicon wafer sample into the metal tube sample and coating an inner part of the metal tube sample. The results are shown in FIG. 8B. As shown in FIG. 8B, it could be seen that, even when the copper thin film was coated on the inside of the metal tube sample using the method of moving the pulse electromagnet back and forth, a pure copper thin film which did not include impurities such as oxygen or carbon was deposited. Therefore, it could be seen that the method according to the present invention was very effective in coating the inner wall of the metal tube.

Example 5

Figure 9:
FIG. 9 is an image of a 1 m-long metal tube sample cut into halves in a length direction one hour after a coating experiment on an inner wall of the metal tube sample in Example 5 of the present invention.

In this example, after an experiment of coating an inner wall of a metal tube was performed for an hour using the method used in Example 1, a 1 m-long metal tube sample was cut in a length direction to determine how a copper thin film was coated on the inside of the metal tube sample. As can be seen from an image of FIG. 9, it could be seen that the copper thin film is uniformly coated on the inside of the metal tube sample. Therefore, it could be seen that the inner wall of the metal tube can be effectively coated using the method according to the present invention.

According to the present invention, magnetron sputtering coating can be performed by generating a magnetic field absolutely required for a magnetron sputtering coating process in the form of a pulse magnetic field using the pulse electromagnet mounted around an outside perimeter of the metal tube and applying the negative high-voltage pulse synchronized with the pulse magnetic field generated by the pulse electromagnet to the sputtering target metal tube mounted inside the metal tube and made of a coating film material, thereby generating plasma around the sputtering target metal tube. Also, when plasma is allowed to move by moving the pulse electromagnet back and forth parallel to the metal tube, a magnetron sputtering coating film can be effectively deposited on the entire inside of the metal tube.

According to the method of the present invention, an inner wall of a long metal tube in a hollow tube form used in various industrial fields can be effectively coated for the purpose of protecting the inner wall of the metal tube and improving functionality.

According to the present invention, a magnetron sputtering deposition can be performed on an inner wall of a long metal tube having a small diameter (internal diameter). Also, since a pulse electromagnet is used, a high current can be applied during formation of a magnetic field to form a strong magnetic field. As a result, since an average power consumed to operate the electromagnet can be maintained at a low level while efficiently performing magnetron sputtering, problems of heating of the electromagnet and thus a cooling problem can be effectively solved. Meanwhile, when plasma is allowed to move by moving the pulse electromagnet back and forth parallel to the metal tube, the entire inside surface of the long metal tube can be effectively coated.

It will be apparent to those skilled in the art that various modifications can be made to the above-described exemplary embodiments of the present invention without departing from the scope of the invention. Thus, it is intended that the present invention covers all such modifications provided they come within the scope of the appended claims and their equivalents.

What is claimed is:

1. A method of coating an inner wall of a metal tube, comprising:
   (a) mounting both end openings of a metal tube on mounting posts so that pressure in the metal tube is adjustable by vacuum-evacuation and inflow of process gases;
   (b) coaxially installing a sputtering target metal tube inside the metal tube;
   (c) installing a pulse electromagnet to surround an outside perimeter of the metal tube coaxially with the metal tube;
   (d) vacuum-evacuating the inside of the metal tube;
   (e) allowing a process gas to flow in the inside of the metal tube to set a process gas pressure;
   (f) applying pulse power to the pulse electromagnet to form a pulse magnetic field around the sputtering target metal tube; and
   (g) generating a negative high-voltage pulse synchronized with the pulse power applied to the pulse electromagnet and applying the synchronized negative high-voltage pulse to the sputtering target metal tube, thereby generating plasma, wherein the negative high-voltage pulse applied to the sputtering target metal tube is applied at a predetermined delayed time after the pulse power is applied to the pulse electromagnet.

2. The method of claim 1, wherein a cooling water is provided through a cooling metal tube which is installed along an inside perimeter of the sputtering target metal tube.

3. The method of claim 1, wherein, when a coating process is started by the pulse magnetic field formed by the pulse electromagnet and the negative high-voltage pulse applied to the sputtering target metal tube, the inner wall of the metal tube is coated while moving the pulse electromagnet in an axial direction of the metal tube.

4. The method of claim 1, wherein the process gas pressure set inside the metal tube is in a range of 1 mTorr to 1 Torr.

5. The method of claim 1, wherein the pulse power applied to the pulse electromagnet and the sputtering target metal tube has a pulse frequency of 10 Hz to 1,000 Hz.

6. The method of claim 1, wherein the pulse magnetic field formed around the pulse electromagnet has a strength of 0.1 kG to 10 kG.

7. The method of claim 1, wherein the negative high-voltage pulse applied to the sputtering target metal tube has a pulse voltage of 500 V to 2,000 V.

8. The method of claim 1 or 7, wherein the negative high-voltage pulse applied to the sputtering target metal tube has a pulse width of 10 to 1,000 μsec.

9. The method of claim 1, wherein the time delay is in a range of 50 μsec to 500 μsec.

10. The method of claim 2, wherein a permanent magnet configured to enhance the strength of the pulse magnetic field is disposed inside the cooling metal tube.

* * * * *